United States Patent [19]
Bakhmutsky

[11] Patent Number: 5,650,905
[45] Date of Patent: Jul. 22, 1997

[54] VARIABLE LENGTH DECODER WITH ADAPTIVE ACCELERATION IN PROCESSING OF HUFFMAN ENCODED BIT STREAMS

[75] Inventor: Michael Bakhmutsky, Spring Valley, N.Y.

[73] Assignee: Philips Electronics North America Corporation, New York, N.Y.

[21] Appl. No.: 580,407

[22] Filed: Dec. 28, 1995

[51] Int. Cl.$^6$ ........................................ H03M 7/40
[52] U.S. Cl. ........................................ 341/67; 341/63
[58] Field of Search ........................ 341/67, 63, 64, 341/65, 106

[56] References Cited

U.S. PATENT DOCUMENTS

| | | | |
|---|---|---|---|
| 5,173,695 | 12/1992 | Sun et al. | 341/67 |
| 5,363,097 | 11/1994 | Jan | 341/67 |

FOREIGN PATENT DOCUMENTS

| | | |
|---|---|---|
| 0614317 | 9/1994 | European Pat. Off. . |
| 0631440 | 12/1994 | European Pat. Off. . |

*Primary Examiner*—Todd DeBoer
*Attorney, Agent, or Firm*—Laurie E. Gathman

[57] ABSTRACT

A variable length decoder with adaptive acceleration in processing of an encoded input bit stream which includes an input circuit for receiving the input bit stream and for providing a decoding window that includes a sequence of bits which include one or more code words to be decoded at an output thereof, a code word length decoding circuit for determining the combined length of a combination of two or more code words received from the input circuit in response to a first value of a control signal and for generating a combined length signal representative of the determined combined length, and for determining the length of an individual code word received from the input circuit in response to a second value of the control signal and for generating an individual word length signal representative of the determined length of the individual code word, a computation loop circuit for receiving the combined length signal or the individual word length signal from the code word length decoding circuit and, in response thereto, shifting the decoding window to provide a new sequence of bits that include one or more additional code words to be decoded at the output of the input circuit, a code word value decoding circuit for decoding the values of the combination of two or more code words provided by the input circuit in response to the first value of the control signal, and for decoding the value of the individual code word in response to the second value of the control signal, and, a control circuit for generating the control signal, and controlling the operation of the variable length decoder according to a decoding protocol. In the disclosed embodiment, the two or more code words of the combination of code words are part of a selected group of code words in a Huffman encoded input bit stream whose bit lengths are less than a prescribed number of bits.

25 Claims, 1 Drawing Sheet

VARIABLE LENGTH DECODER WITH ADAPTIVE ACCELERATION IN PROCESSING OF HUFFMAN ENCODED BIT STREAMS

BACKGROUND OF THE INVENTION

The present invention relates generally to variable length decoders used in data transmission systems, and more particularly, to a variable length decoder for decoding digital video data for high definition television (HDTV).

In digital video dam transmission systems, video data is encoded prior to being transmitted to a receiver, which decodes the encoded digital video data. The decoded digital video data is then output to a subsequent signal processing stage. To increase the data throughput and memory efficiency of such systems, statistical compression algorithms are used to compress and encode the digital video data. One such compression algorithm is the Huffman coding algorithm. Compressing the data typically results in data streams segmented into variable length code words rather than fixed length code words. Variable length decoders decode the variable length code words comprising the compressed data stream.

There are several presently available methods for decoding a sequence of variable length code words. The most prevalent methods are the tree searching algorithm and the table look-up technique.

The tree searching algorithm uses a bit-by-bit search through a code tree to find the end and value of each code word in the input bit stream. The coding tree includes leaves of known code words. The decoding process begins at the root of the coding tree and continues bit-by-bit to different branches of the coding tree, depending upon the decoded value of each successive bit in the bit stream. Eventually a leaf is reached and the end of the code word is detected. The code word is then segmented from the rest of the bit stream and the value of the detected code word is looked up and output from the variable length decoder. Decoding a bit stream using the tree searching algorithm is too slow for many high speed applications, since the decoding operation is performed at the bit rate rather than at the symbol rate. In this connection, decoding a bit stream at the bit rate does not satisfy the peak symbol rate requirements of an HDTV decoder.

To increase the data throughput of a variable length decoder, a table look-up decoder was developed, such as the one disclosed in U.S. Pat. No. 5,173,695, issued to Sun et al., the disclosure of which is herein incorporated by reference. The input of the table look-up decoder disclosed in the above-referenced patent is connected to the output of a rate buffer which receives a variable-word-length encoded bit stream at its input and outputs in parallel sequences of bits equal in length to the maximum length code word in the bit stream. These sequences are read into cascaded latches. The cascaded sequences in both latches are input to a barrel shifter which provides from its multi-bit input, a sliding decoding window to a table-lookup decoder. A control signal directly shifts the position of the decoding window of the barrel shifter as each code word is detected. To detect each code word, the initial bits in the decoding window are compared with code word entries in the table-lookup decoder. When a code word is detected, the corresponding code word length is added to the value of an accumulator with previously accumulated code word lengths to produce the control signal which directly shifts the decoding window by the number of bits in the just decoded word. When all of the bits in the first latch have been decoded, the next bit sequence in the buffer is input to the second latch while the previous bit sequence in the second latch is transferred to the first latch. The decoding window is then shifted to the beginning of the next undecoded sequence. The shifting of the decoding window and the decoding of the code word can be done in one clock cycle. As a result, the table look-up decoder is capable of decoding one code word per clock cycle regardless of its bit length, thereby dramatically increasing the data throughput of the decoder relative to the previously available tree searching algorithm decoder.

Although the table look-up decoder described in the above-referenced Sun et al. patent can decode at a symbol rate, rather than a bit rate, its actual speed of operation is limited by the propagation delay through the feedback loop consisting of the barrel shifter, word length decoder, and adder-accumulator. In HDTV applications, where the peak symbol rate can be over 100 million code words per second, decoding the whole picture at the symbol rate with a single table look-up decoder becomes impractical. In HDTV systems, the variable length decoder (VLD) is used to extract an entire picture from a rate buffer within the picture display time. If the VLD is not capable of operating at the peak symbol rate, then the pictures that carry more data than can be processed in a limited picture display time will cause the decoder to crash because the VLD will fail to extract all of the picture from the rate buffer. This may have devastating consequences for the picture quality. Thus, the VLD must decode words in the data stream at the peak symbol rate (PSR) in order to decode the pictures without a potential for such failure.

For HDTV systems which use the MPEG ("Moving Pictures Expert Group") protocol, a VLD throughput of 100 million or more code words per second is required. In addition to the technical problems associated with implementing the VLD itself with such high throughput, the high-speed VLD interface with the large capacity rate buffer is quite expensive with the currently available memory technology. The problem becomes more severe if price is an issue, since faster and more expensive memory devices such as static random access memories (SRAMs) and synchronous dynamic random access memories (SDRAMs) must be used, rather than slower and cheaper memory devices such as asynchronous DRAMs. Of course, the price of the memory is a particularly important consideration for a consumer product, such as an HDTV set.

In current implementations, HDTV systems are normally partitioned into multiple processing paths, using multiple VLDs to decode different portions of the picture in parallel. In such implementations, the VLD is one of the major bottlenecks. Because each partition of the picture may contain almost all of the picture information, multiple dedicated ping-pong buffers are required between all of the VLDs and the rate buffer, thereby dramatically increasing the amount of bit stream memory required for the system. For example, a partitioned decoding system having eight parallel VLDs requires eight ping-pong buffers, each one of the ping-pong buffers being twice the size of the rate buffer, thereby increasing the amount of required buffer memory by a factor of sixteen over a system having a single VLD.

In HDTV systems, the digital video data is a Huffman encoded bit stream which contains the code words to be decoded. In Huffman encoded bit streams, the code words which have the highest probability of occurence have the smallest number of bits, and code words which have the lowest probability of occurence have the greatest number of bits. Thus, Huffman encoded bit streams contain code words whose bit length is a function of the probability of occurence of the code word in the bit stream. The picture size is normally limited to a certain number of bits rather than a certain number of code words. If one code word is decoded per clock cycle, then the worst case scenario with respect to VLD throughput is the case where the entire picture is comprised of the smallest code words, since the average number of bits decoded per clock cycle would be at a minimum for this picture. Thus, the smallest code words in the Huffman encoded bit stream are the cause of such high peak symbol rates in HDTV systems.

Based on the above and foregoing, it can be appreciated that there presently exists a need in the art for a variable length decoder which overcomes the above-discussed drawbacks and shortcomings of the presently available technology, and which can be used to implement a single VLD HDTV decoder, rather than a partitioned HDTV decoder. More particularly, there presently exists a need in the art for a variable length decoder having a data throughput which is adequate for processing digital video data, but at a lower clock rate, thereby enabling the use of cheaper (slower) memory and making more practical the implementation of the variable length decoder.

As will become apparent hereinafter, the present invention fulfills this need in the art by providing a variable length decoder whose throughput per clock cycle is adaptively increased for a selected group of code words in the Huffman encoded bit stream which have a bit length less than a prescribed number, by decoding combinations of two or more code words from the selected group, during a single clock cycle, using a combination value look-up table which contains all possible combinations of code words from the selected group as additional entries. Since these smaller code words are statistically the most frequently occuring code words in the Huffman encoded bit stream, the throughput of the VLD of the present invention is significantly higher than that of the presently available VLDs, at a clock rate that is significantly lower than that of the presently available VLDs. In addition to this improved statistical performance due to adaptive acceleration in decoding code words within the selected group, the VLD of the present invention also guarantees a higher average minimum code word length, thereby enabling a reduction in the clock rate without sacrificing throughput.

SUMMARY OF THE INVENTION

The present invention encompasses a variable length decoder whose throughput per clock cycle is adaptively increased for a selected group of words in a Huffman encoded bit stream which have a bit length less than a prescribed number, by decoding combinations of two or more code words from the selected group, during a single clock cycle, using a combination value look-up table which contains all possible combinations of code words from the selected group as additional entries.

The variable length decoder of the present invention includes an input circuit for receiving the encoded bit stream. The input circuit outputs a parallel sequence of bits that include code words to be decoded. A code word length computation circuit determines (computes) the lengths of combinations of code words from the selected group in response to a first value of a control signal received from a control circuit, and decodes the lengths of individual code words in response to a second value of the control signal received from the control circuit.

A feedback circuit communicates word length information from the code word length computation circuit to the input circuit for enabling the input circuit to provide a new sequence of bits that include code words to be decoded at the output of the input circuit.

The variable length decoder further includes a code word value decoding circuit for decoding the values of combinations of code words as well as individual code words. The value decoding circuit decodes combinations of code words from the selected group in response to the first value of the control signal, and decodes individual code words in response to the second value of the control signal from the control circuit. The control circuit generates the control signal and controls the operation of the variable length decoder in accordance with a decoding protocol, on the basis of the current and previously decoded code words.

BRIEF DESCRIPTION OF THE DRAWING

The above and other objects, features, and advantages of the present invention will become apparent from the following detailed description taken in conjunction with the accompanying drawing, in which.

DETAILED DESCRIPTION OF THE INVENTION

Figure 1:
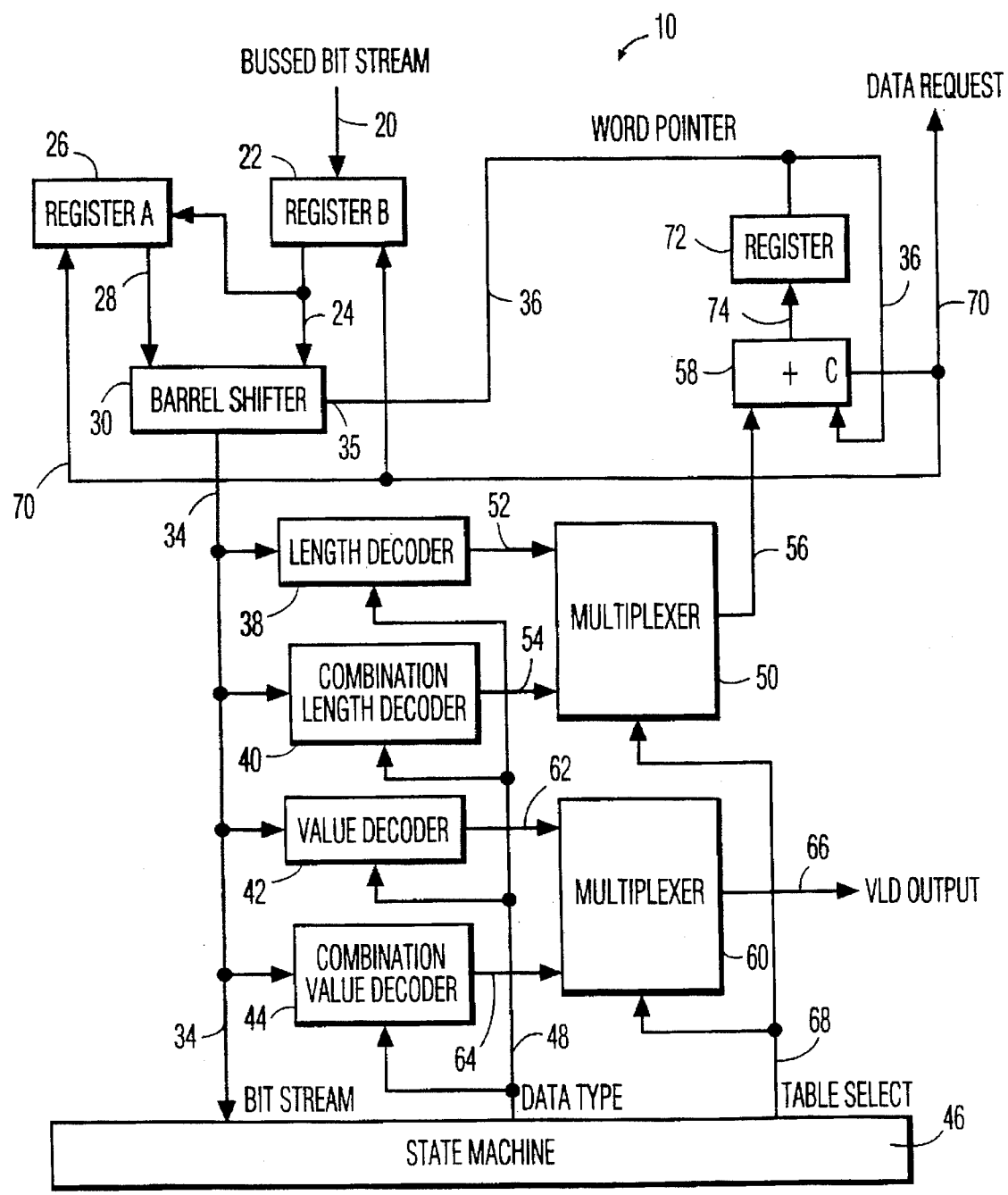
FIG. 1 is a block diagram of a specific, illustrative embodiment of the variable length encoder of the present invention.

The present invention is described below in reference to the accompany drawings in which like reference numerals denote like parts. While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

FIG. 1 is a block diagram of a specific embodiment of the variable length decoder of the present invention. An input bit stream 20 contains code words to be decoded. In the present specific embodiment, the input bit stream 20 is a Huffman encoded bit stream. As previously described, in Huffman encoded bit streams, the code words which have the highest probability of occurence have the smallest number of bits, and the code words which have the lowest probability of occurence have the greatest number of bits. Thus, Huffman encoded bit streams contain code words whose bit length is a function of the probability of occurence of the code word in the bit stream.

A first register 22 is connected to a barrel shifter 30 via thirty-two (32) parallel input bit lines 24, each line corresponding to a bit in the first register 22. A second register 26 is connected to the barrel shifter 30 via thirty-two (32) parallel input bit lines 28, each line corresponding to a bit in the second register 26. Thus, a total of sixty-four (64) parallel input bit lines 24, 28 are connected to the barrel shifter 30, thereby providing a corresponding sequence of sixty-four (64) available input bits for the barrel shifter 30. The barrel shifter 30 has a shift input 35 and thirty-two (32) parallel output bit lines 34. Those skilled in the art will appreciate that other numbers of parallel input bit lines 24, 28 and parallel output bit lines 34 may be utilized without departing from the spirit and scope of the present invention. In the present specific embodiment, the number of parallel input bit lines 24, the number of parallel input bit lines 28, and the number of parallel output bit lines 34 are each chosen to be equal in number to the maximum number of bits in a code word (i.e., maximum code word length).

Initially, in response to a data request signal applied over the line 70, a sequence of thirty-two bits representing code words to be decoded is loaded into the first register 22 from the input bit stream 20. Once the first register 22 is loaded with bits, the contents of the first register 22 are transferred to the second register 26 over thirty-two (32) parallel bit lines 24, and the next sequence of thirty-two bits from the input bit stream 20 is loaded into the first register 22. Thus, a sequence of sixty-four input bits is available to the barrel shifter 30. The thirty-two parallel output bit lines 34 are chosen from the sixty-four parallel input bit lines 24, 28 in a manner discussed below, to thereby provide a decoding window 34. The decoding window 34 is shifted from left to right across the sequence of available input bits in response to a word pointer applied over a line 36 to the shift input 35 of the barrel shifter 30. The decoding window 34 is shifted by the word pointer across the sequence of available input bits according to the length (or combined length) of the code word(s) decoded during a previous clock cycle, so that the start of a next code word(s) to be processed during the current clock cycle begins at the left edge of the decoding window 34.

The value of the word pointer is summed by an adder 58 with the decoded length or combined length(s) of the code word(s) decoded during a current clock cycle. The output of the adder 58 is loaded into a register 72, the output of which is the word pointer. (Of course, when the system is initialized, the register 72 is initialized to zero.) When the sum of the current value of the word pointer plus the decoded length or combined length(s) of the code word(s) decoded during the current clock cycle (hereinafter referred to as the "loop sum") exceeds the bit width of the decoding window 34 (i.e., thirty-two in the present specific embodiment), the adder 58 overflows or loops around "0", and generates a carry output "C" which is applied to the data request line 70, thus triggering a "data reload" operation, in which the contents of the first register 22 are transferred to the second register 26, and the next sequence of thirty-two bits from the input bit stream 20 are loaded into the first register 22. When the adder 58 overflows, the output value of the adder 58 is equal to the amount by which the "loop sum" exceeds thirty-two (i.e., "loop sum" minus 32). Thus, the word pointer shifts the left edge of the decoding window 34 to the input bit equal to this difference. For example, if the "loop sum" is forty, then the output of the adder is eight, and thus, the word pointer will shift the left edge of the decoding window 34 to the eighth available input bit.

The decoding window 34 is input to a length decoder 38, a combination length decoder 40, a value decoder 42, a combination value decoder 44, and a control circuit 46. The control circuit 46 detects the code words or groups of code words to be decoded within the decoding window 34, and provides the length decoders 38, 40 and the value decoders 42, 44 with information about the types of code words being processed.

The length decoder 38 has a standard Huffman look-up table for determining the lengths of single code words within the decoding window 34, and the combination length decoder 40 has a look-up table which contains additional entries corresponding to all possible combinations of code words with bit lengths below the specified number of bits, for determining the lengths of a combination of two or more code words within the selected group of code words having a bit length less than a prescribed number of bits.

The value decoder 42 has a standard Huffman look-up table for determining the values of single code words within the output decoding window 34. The combination value decoder 44 has a look-up table which contains additional entries corresponding to all possible combinations of code words with bit lengths below the specified number of bits. Combinations of two or more of the smaller code words within the selected group having bit lengths below the specified number are decoded together, thereby significantly increasing the throughput of the variable length decoder 10 at a clock rate that is significantly lower than the symbol rate, relative to the conventional table look-up decoder disclosed in the above-referenced Sun et al. patent.

Control signals produced by the control circuit 46 are applied to the value decoders 42, 44 over the control lines 48 and 68. The control signals convey information about the types and number of code words to be decoded in a given clock cycle. These control signals are used in a manner described below to select the length decoder 38 and the value decoder 42 for processing a single code word, and to select the combination length decoder 40 and the combination value decoder 44 for processing a combination of two or more code words from the selected group, and further, to select the appropriate look-up table for decoding the code word(s) being processed.

The output of the length decoder 38 provides a first multiplexer input 52 to a length multiplexer 50. The output of the combination length decoder 40 provides a second multiplexer input 54 to the length multiplexer 50. The output of the length multiplexer 50 provides a first input 56 to the adder 58. The first input 56 is switched between the first multiplexer input 52 and the second multiplexer input 54 by the length multiplexer 50 in response to the control signal received over the line 68 by the length multiplexer 50 from the control circuit 46, depending upon whether a single code word or a combination of two or more code words from the selected group are being processed.

The output of the value decoder 42 provides a first multiplexer input 62 to a value multiplexer 60. The output of the combination value decoder 44 provides a second multiplexer input 64 to the value multiplexer 60. The output of the value multiplexer 60 is applied over the line 66 as the output of the variable length decoder 10. The output 66 is switched between the first multiplexer input 62 and the second multiplexer input 64 of the value multiplexer 60 in response to the control signal received over the line 68 by the value multiplexer 60 from the control circuit 46.

As previously described, the control circuit 46 determines whether a single code word or combination of two or more code words is to be decoded in a given clock cycle, on the basis of the current and previously decoded code words, in accordance with the decoding protocol. In this regard, the control circuit 46 determines whether the current code word(s) in the Huffman encoded bit stream has (have) a bit length less than the prescribed number, i.e., whether the current code word(s) is (are) in the selected group of code words to be decoded in combination. If a single code word (i.e., a code word which is not in the selected group) is to be decoded during a given clock cycle, the control circuit 46 selects the first multiplexer input 52 of the length multiplexer 50, and selects the first multiplexer input 62 of the value multiplexer 60, via the control signal applied over the line 68. The decoded length of the single code word is output from the length multiplexer 50, and the decoded value of the single code word is output from the variable length decoder 10 over the output line 66.

If a combination of code words is to be decoded in a given clock cycle, the control circuit 46 selects the second multiplexer input 54 of the length multiplexer 50, and selects the second multiplexer input 64 of the value multiplexer 60 via the control signal applied over the line 68. The combined length of the combination of code words is output from the length multiplexer 50, and the values of the groups of code words are output from the variable length decoder 10 at the output 66.

The first input 56 to the adder 58 is used by the adder 58 and the register 72 to update the word pointer applied over the line 36 to the shift input 35 of the barrel shifter 30. The word pointer is also the second input to the adder 58. The word pointer applied over the line 36 represents the current position of the left edge of the decoding window 34. The adder 58 adds the value of the word pointer to the length (or combined length) of the last decoded code word (or combination of code words). The resulting "loop sum" applied over the line 74 represents the updated value of the word pointer which will be used in the next clock cycle to shift the decoding window 34 across the parallel sequence of available input bits so that the left edge of the decoding window 34 begins a sequence of bits that form the next code word to be decoded. The loop sum applied over the line 74 is stored in the register 72. The output of the register 72, which is the updated (current) word pointer, is coupled to the shift input 35 of the barrel register 30 over the line 36, to thereby shift the decoding window 34 to the next code word to be decoded. The position of the decoding window 34 is shifted every clock cycle with respect to the sequence of available input bits as new code words are decoded.

In the present specific embodiment, code words within the selected group are combined in pairs. However, of course, this is not limiting to the present invention. In general, if M symbols are contained in a selected group of code words having bit lengths less than or equal to a specified number of bits N, an additional entry is made in the combination look-up table for every possible combination of the M symbols. Hence, $M^2$ additions are made to the Huffman table. The larger the specified number of bits N, the larger M becomes. As M becomes larger, additional entries (decoding combinations) are required in the look-up tables of the combination length decoder 40 and the combination value decoder 44. As the specified number of bits N increases, so does M. However, the speed of the variable length decoder increases as N increases since more code words on average are processed per clock cycle.

By applying parallelism in the processing of selected groups of code words in the Huffman encoded bit stream, the variable length decoder 10 of the present invention accelerates the processing of smaller code words in the Huffman encoded bit stream. The occurrence of many small code words in the input bit stream 20 increases the peak code word (symbol) rate for a particular picture, and therefore increases the rate at which the variable length decoder 10 needs to be clocked. By adding additional entries to the conventional Huffman loop-up table, the processing of two or more small code words together in one clock cycle becomes possible. By processing the small code words together, a reduced clock rate is required, and enhanced throughput is obtained.

For illustrative purposes, the present invention is applied to MPEG-2 Main Profile, High Level compliant HDTV decoder applications. In such applications, the maximum supported horizontal resolution (H) is 1920 pixels. The maximum supported vertical resolution (V) is 1080 pixels. The non-coefficient data overhead (OVHD) is 0.05. Utilizing this information, the maximum number of symbols (MNSP), i.e. code words, that may be processed per picture can be calculated according to the following equation (1):

$$MNSP=1.5*H*V/(1-OVHD)=3,274,105 \text{ symbols.} \qquad (1)$$

In the above expression (1), the total number of samples is multiplied by 1.5 to account for chrominance information since chrominance information is included in the symbol count. The MNSP is divided by (1−OVHD) to account for overhead, i.e. header information. If data in the input bit stream 20 has a low compression factor, the number of symbols may approach or even exceed the number of samples.

In the extreme case, the largest picture to be processed occupies the full size of the rate buffer (not shown). The smallest average symbol length in bits (LMIN) is a function of the size of the rate buffer (not shown) (B) and the MNSP. For an MPEG-2 Main Profile, High Level complaint HDTV decoder, the size B of the rate buffer is 9,781,248 symbols. Thus, the smallest average symbol length in bits (LMIN) can be calculated according to the following equation (2):

$$LMIN=B/MNSP=(9,781,248)/(3,274,105)=2.99 \text{ bits/symbol.} \qquad (2)$$

The peak symbol rate (PSR) of the variable length decoder 10 corresponds to the maximum number of symbols that must be processed per second in the present extreme case. The PSR is a function of the MNSP and the frame rate (F) which specifies the number of pictures processed per second. In a presently contemplated MPEG-2 application, F is 30 pictures per second. Thus, the peak symbol rate (PSR) can be calculated according to the following equation (3):

$$PSR=MNSP*F=(3,274,105)*(30)=98,223,150 \text{ symbols/second.} \qquad (3)$$

The variable length decoder disclosed in U.S. Pat. No. 5,173,695 to Sun et al. must be able to operate at a clock rate greater than or equal to the PSR. Otherwise, the variable length decoder may not decode the entire picture during the picture display time. Clock rates higher than 98 MHz are difficult to achieve using current technology.

The present invention solves the problem resulting from high PSRs in MPEG-2 Main Profile, High Level compliant HDTV decoders by selectively applying parallelism to a small group of Discrete Cosine Transform (DCT) coefficients of the smallest bit length. The present inventive decoder 10 guarantees a higher LMIN which results in a lower PSR.

The Huffman look-up table for DCT coefficients starts with the symbols having the highest probability of occurrence. Symbols with the highest probability of occurrence have smaller bit lengths. In the beginning of the Huffman look-up table, the bit length of code words grows quickly as the number of possibilities for branching is limited. Therefore, for a small specified bit length N, the number of code words having the same length is very limited, and it is thus apparent that the number of symbols M having a bit length less than or equal to N can not be a large number if N is kept small.

If the length of each code word or symbol in a group of M symbols in the beginning of the Huffman look-up table does not exceed the specified bit length N, the M symbols are combined and processed together with every other symbol in the same group (including itself) in the same clock cycle. Since the total number of combined symbol pairs is limited to $M^2$, the combined symbol pairs may be entered as new entries in the Huffman look-up table. The number of additional entries is scaled according to N. If N is small, M is relatively small.

Statistically, adding additional entries to the Huffman look-up table according to the teachings of the present invention results in sharply improved variable length decoder performance, since all of the high-probability coefficients (small bit length code words) are processed with double throughput.

In MPEG-2, the smallest DCT coefficient has a length of two bits. The Huffman look-up table has code word entries of bit length two and higher as follows: 2,3,4,5 ... N, N+1, N+2, N+3 ... M symbols comprising DCT coefficients with a bit length up to N are grouped together. None of the combinations in the group of M symbols will result in a PSR as high as 98,223,150 code words per second. The consistent combinations of code words with bit lengths of 2 bits for the entire picture are not possible due to the fact that the smallest average bit length is at least 2.99 bits. The consistent combinations of code words with bit lengths of 3 bits results in a great reduction in the PSR since all code words with bit lengths of 3 bits will be combined in pairs and processed with double throughput. Every other combination within the group of M symbols will increase the smallest average symbol length LMIN, which corresponds to decreasing the MNSP, which corresponds to decreasing the PSR and increasing the throughput per clock cycle.

The combinations resulting in the smallest possible bit lengths for this example are the combinations of the shortest (smallest) symbols of group M and the shortest (smallest) symbols of a next group. The next group corresponds to the group including the symbols of bit length N+1, N+2 and so on. By combining only the smallest symbols from the group M and the smallest symbols of the next group, the smallest value of LMIN is obtained, and hence, the smallest reduction in the PSR. As an example, if lengths of code words in the input bit stream 20 are represented by the sequence 2, N+1, 2, N+1, 2, N+1 ..., the smallest average bit length per symbol, i.e. LMIN, can be calculated according the following equation (4):

$$LMIN=(2+N+1)/2. \quad (4)$$

In the above expression (4), the symbols of bit length 2 and (N+1) are processed in two clock cycles. Thus, to obtain the value of LMIN for one clock cycle, the sum (2+N+1) must be divided by two.

The maximum number of these symbols that may fit into the rate buffer, i.e. MNSP, can be calculated according the following equation (5):

$$MNSP=B/LMIN=2*B/(2+N+1). \quad (5)$$

The minimum clock rate required to process this picture with full throughput, i.e. the PSR, can be calculated according the following equation (6):

$$PSR=\text{clock rate}=(2*B/(2+N+1))*F. \quad (6)$$

To illustrate the above in a practical manner, the PSR is calculated with N=6, N=5, N=4, F=30 pictures per second, and B=9,781,248 bits for an MPEG-2 Main Profile, High Level compliant HDTV decoder. As previously described, conventional variable length decoders, e.g., such as disclosed in the above-referenced Sun et al. patent, require clock rates of about 98.223 MHz. For N=6, the required clock rate of the variable length decoder of the present invention is 65.208 MHz, which constitutes a 33.61% reduction in the required clock rate. For N=5, the required clock rate is 73.359 MHz, which constitutes a 25.31% reduction in the required clock rate. For N=4, the required clock rate is 83.839 MHz, which constitutes a 14.64% reduction in the required clock rate.

The above examples assume that none of the most probable accelerated combinations have ever been encountered, and is the absolute worst case picture. Statistically, the actual gain in performance using the variable length decoder 10 of the present invention is obviously much greater. Such a significant reduction in the processing clock rate makes a VLSI implementation of a variable length decoder constructed in accordance with the teachings of the present invention much more feasible.

Although the above description contains many specificities, these should not be construed as limiting the scope of the invention but as merely providing illustrations of some of the presently preferred embodiments of this invention. For example, the performance of the variable length decoder of the co-pending patent application entitled "One-Hot Variable Length Decoder", to M. Bakhmutsky et al., whose teachings are herein incorporated by reference, may be significantly enhanced utilizing the teachings of the present invention. In addition, excellent results may be obtained by combining different types of code words rather than just DCT coefficients. For example, code words representing motion vectors may also be combined according to the teachings of the present invention.

In general, although a preferred embodiment of the present invention has been described in detail hereinabove, it should be clearly understood that many variations and/or modifications of the basic inventive concepts herein taught which may appear to those skilled in the pertinent art will still fall within the spirit and scope of the present invention, as defined in the appended claims.

What is claimed is:

1. A variable length decoder with adaptive acceleration in processing of an encoded input bit stream, comprising:

input means for receiving the input bit stream and for providing a decoding window that includes a sequence of bits which include one or more code words to be decoded at an output thereof;

code word length decoding means for determining the combined length of a combination of two or more code words received from said input means in response to a first value of a control signal and for generating a combined length signal representative of the determined combined length, and for determining the length of an individual code word received from said input means in response to a second value of said control signal and for generating an individual word length signal representative of the determined length of said individual code word;

computation loop means for receiving said combined length signal or said individual word length signal from said code word length decoding means and, in response thereto, shifting said decoding window to provide a new sequence of bits that include one or more additional code words to be decoded at said output of said input means;

code word value decoding means for decoding the values of said combination of two or more code words provided by said input means in response to said first value of said control signal, and for decoding the value of said individual code word in response to said second value of said control signal; and, control means for generating said control signal, and controlling the operation of said variable length decoder according to a decoding protocol.

2. The variable length decoder as set forth in claim 1, wherein said code word length computation means includes a combination word length decoder for determining the combined length of said combination of two or more code words received from said input means, and an individual word length decoder for determining the length of said individual code word received from said input means.

3. The variable length decoder as set forth in claim 2, wherein said two or more code words of said combination of code words are part of a selected group of code words in said input bit stream whose lengths are less than a prescribed number of bits.

4. The variable length decoder as set forth in claim 3, wherein the combined lengths of all possible combinations of code words of said selected group of code words are stored as entries in a look-up table in said combination word length decoder.

5. The variable length decoder as set forth in claim 4, wherein said code word value decoding means includes an individual word value decoder for decoding the value of said individual code word, and a combination value decoder for decoding the value of said combination of two or more code words.

6. The variable length decoder as set forth in claim 5, wherein the combined values of all possible combinations of code words of said selected group of code words are stored as entries in a look-up table in said combination word value decoder.

7. The variable length decoder as set forth in claim 6, wherein said computation loop means includes:

a multiplexer having a first input coupled to said individual word length signal, and a second input coupled to said combined word length signal, wherein said individual word length signal is selected as an output of said multiplexer in response to said first value of said control signal, and said combined word length is selected as said output of said multiplexer in response to said second value of said control signal; and, an adder having a first input coupled to said output of said multiplexer, and a second input coupled to an output of said adder which comprises a word pointer for shifting said decoding window of said input means.

8. The variable length decoder as set forth in claim 7, wherein said adder generates a carry output for requesting a new sequence of bits from said input bit stream to be loaded into said input means in the event of overflow of said adder.

9. The variable length decoder as set forth in claim 8, wherein said control means includes a state machine and associated logic circuitry for controlling the operation of the variable length decoder in accordance with said decoding protocol.

10. The variable length decoder as set forth in claim 9, wherein said control means determines the type and number of the next code words to be processed by said code word length decoding means and said code word value decoding means based upon previously and currently decoded code words, in accordance with said decoding protocol, and generates said control signal in response to this determination, and also generates an additional control signal for selecting proper look-up tables in said code word length decoding means and said code word value decoding means in response to this determination.

11. The variable length decoder as set forth in claim 10, wherein said input bit stream is a Huffman encoded bit stream.

12. The variable length decoder as set forth in claim 1, wherein said input bit stream is a Huffman encoded bit stream.

13. The variable length decoder as set forth in claim 11, wherein said selected group of code words includes all code words in said Huffman encoded input bit stream which have less than said prescribed number of bits.

14. The variable length decoder as set forth in claim 8, wherein said input means comprises:

a first register for receiving said input bit stream, and for outputting a first parallel sequence of input bits;

a second register coupled to an output of said first register, and for outputting a second parallel sequence of input bits;

a barrel shifter having an input coupled to said first and second parallel sequences of input bits to thereby provide a parallel sequence of available input bits equal in number to the total of said first and second parallel sequences of input bits, and for providing said decoding window at an output thereof; and, wherein said decoding window is shifted in response to said word pointer across said parallel sequence of available input bits.

15. The variable word length decoder as set forth in claim 14, wherein a new sequence of bits from said input bit stream is loaded into said first register and the contents of said first register are transferred into said second register in response to said carry signal generated by said adder.

16. The variable length decoder as set forth in claim 15, wherein the bit width of said decoding window is at least equal to the bit length of the maximum length code word in said input bit stream.

17. The variable length decoder as set forth in claim 16, wherein the bit width of said parallel sequence of available input bits is greater than the bit width of said decoding window.

18. The variable length decoder as set forth in claim 17, wherein the bit width of said parallel sequence of available input bits is sixty-four bits, and the bit width of said decoding window is thirty-two bits.

19. A method for processing an input bit stream with adaptive acceleration, comprising the steps of:

receiving the input bit stream and providing a decoding window that includes a sequence of bits which include one or more code words to be decoded;

determining the combined length of a combination of two or more code words in said decoding window in response to a first value of a control signal and generating a combined length signal representative of the determined combined length, and determining the length of an individual code word in said decoding window in response to a second value of said control signal and generating an individual word length signal representative of the determined length of said individual code word;

shifting said decoding window to provide a new sequence of bits that include one or more additional code words to be decoded at said output of said input means, in response to said combined length signal or said individual word length signal; and, decoding the values of said combination of two or more code words in said decoding window in response to said first value of said control signal, and decoding the value of said individual code word in response to said second value of said control signal.

20. The method as set forth in claim 19, wherein said two or more code words of said combination of code words are part of a selected group of code words in said input bit stream whose lengths are less than a prescribed number of bits.

21. The method as set forth in claim 20, wherein the combined lengths of all possible combinations of code words of said selected group of code words are stored as entries in a look-up table in a combination word length decoder used in performing the determining step.

22. The method as set forth in claim 21, wherein the combined values of all possible combinations of code words of said selected group of code words are stored as entries in a look-up table used in performing the determining step.

23. The method as set forth in claim 20, wherein said input bit stream is a Huffman encoded bit stream.

24. The method as set forth in claim 23, wherein said selected group of code words includes all code words in said Huffman encoded bit stream which have less than said prescribed number of bits.

25. A variable length decoder with adaptive acceleration in processing of an encoded input bit stream, comprising:

an input circuit for receiving the input bit stream and for providing a decoding window that includes a sequence of bits which include one or more code words to be decoded at an output thereof;

a code word length decoding circuit for determining the combined length of a combination of two or more code words received from said input circuit in response to a first value of a control signal and for generating a combined length signal representative of the determined combined length, and for determining the length of an individual code word received from said input circuit in response to a second value of said control signal and for generating an individual word length signal representative of the determined length of said individual code word;

a computation loop circuit for receiving said combined length signal or said individual word length signal from said code word length decoding circuit and, in response thereto, shifting said decoding window to provide a new sequence of bits that include one or more additional code words to be decoded at said output of said input circuit;

a code word value decoding circuit for decoding the values of said combination of two or more code words provided by said input circuit in response to said first value of said control signal, and for decoding the value of said individual code word in response to said second value of said control signal; and, a control circuit for generating said control signal, and controlling the operation of said variable length decoder according to a decoding protocol.

* * * * *